United States Patent
Oh et al.

(10) Patent No.: US 8,471,774 B2
(45) Date of Patent: Jun. 25, 2013

(54) APPARATUS AND METHOD FOR MEASURING ANTENNA RADIATION PATTERNS

(75) Inventors: Soon-Soo Oh, Daejeon (KR);
Yong-Heui Cho, Daejeon (KR); In-Kui Cho, Daejeon (KR); Je Hoon Yun, Daejeon (KR); Soon Ik Jeon, Daejeon (KR); Chang-Joo Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 450 days.

(21) Appl. No.: 12/678,203

(22) PCT Filed: Sep. 19, 2008

(86) PCT No.: PCT/KR2008/005559
§ 371 (c)(1),
(2), (4) Date: Mar. 15, 2010

(87) PCT Pub. No.: WO2009/038388
PCT Pub. Date: Mar. 26, 2009

(65) Prior Publication Data
US 2010/0207827 A1     Aug. 19, 2010

(30) Foreign Application Priority Data
Sep. 19, 2007    (KR) .................. 10-2007-0095206

(51) Int. Cl.
*G01R 29/10*        (2006.01)
*H01Q 3/00*         (2006.01)

(52) U.S. Cl.
USPC .......................................... 343/703; 342/360

(58) Field of Classification Search
USPC .......................................... 343/703; 342/360
See application file for complete search history.

(56) References Cited

U.S. PATENT DOCUMENTS

| | | | | |
|---|---|---|---|---|
| 4,968,983 A * | 11/1990 | Maeda | .......................... | 343/703 |
| 5,365,241 A * | 11/1994 | Williams et al. | .............. | 343/703 |
| 5,432,523 A * | 7/1995 | Simmers et al. | .............. | 343/703 |
| 6,191,744 B1 | 2/2001 | Snow et al. | | |
| 6,288,683 B1 | 9/2001 | Deguchi et al. | | |
| 6,914,571 B1 | 7/2005 | Lemanczyk et al. | | |
| 7,928,906 B2 * | 4/2011 | Leather et al. | ................ | 342/360 |

FOREIGN PATENT DOCUMENTS

| KR | 2005-0113772 A | 12/2005 |
|---|---|---|
| KR | 2007-0085464 A | 8/2007 |
| WO | WO-2006-047677 A1 | 5/2006 |

OTHER PUBLICATIONS

Oh, S.-S. et al., "Antenna Measurement on Cylindrical Surface in Fresnel Region Using Direct Far-Field Measurement System", ETRI Journal, vol. 29, No. 2, pp. 135-142, Apr. 2007.
Soon-Soo Oh et al., "New Method for Predicting the Electromagnetic Field at a Finite Distance Using Fresnel Field Transformation", IEEE Antennas and Wireless Propagation Letters, vol. 7, Mar. 31, 2008.
Wu, K. et al., "A method of transforming Fresnel field to far field for circular aperture antennas", Antennas and propagation society international symposium, vol. 1, pp. 216-219, May 7, 1990.
R. L. Lewis "Highly efficient processing for near-field spherical scanning data reduction", IEEE Antenna propagation Soc. Int. Symp., pp. 251-254, Oct. 13, 1976.

* cited by examiner

*Primary Examiner* — Michael C Wimer
(74) *Attorney, Agent, or Firm* — Rabin & Berdo, P.C.

(57) ABSTRACT

An antenna radiation pattern measurement device that measures a radiation pattern of an AUT by using a source antenna includes a control unit, an analysis unit, and a measurement unit. The control unit controls driving of the source antenna and the AUT. The analysis unit measures an electric field value from a radio frequency (RF) signal that is transmitted from one of the source antenna and the AUT and received by the other antenna. In addition, the measurement unit controls the control unit and the analysis unit and measures a radiation pattern of the AUT by using the electric field value.

11 Claims, 6 Drawing Sheets

Fig. 3
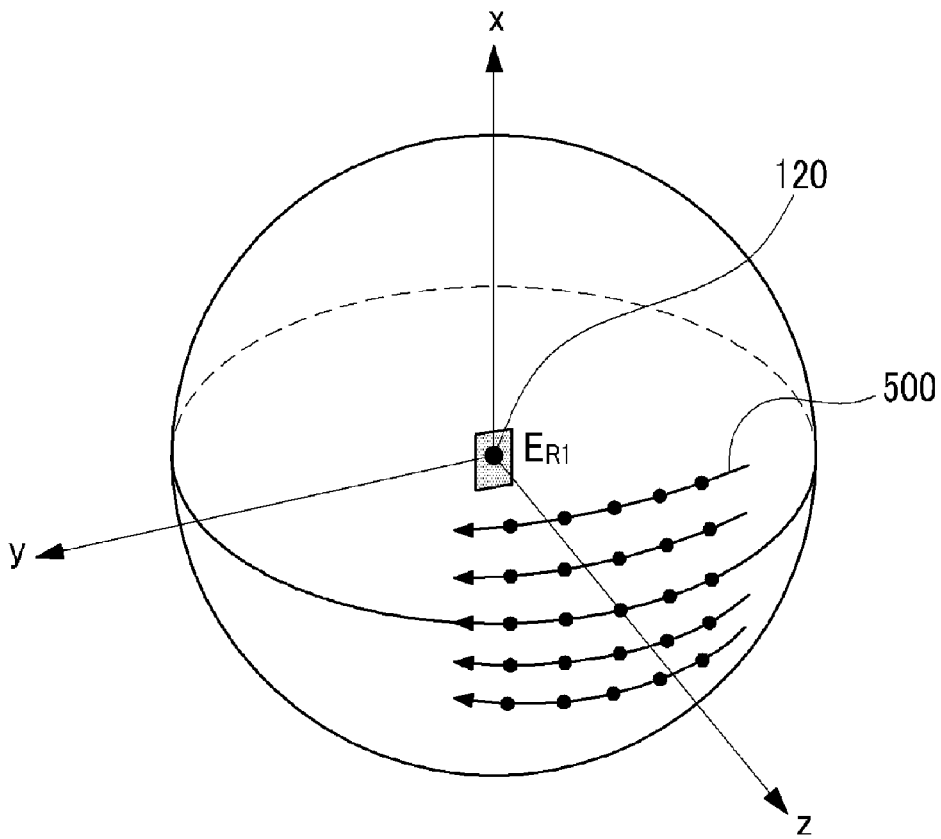
[Fig. 4]
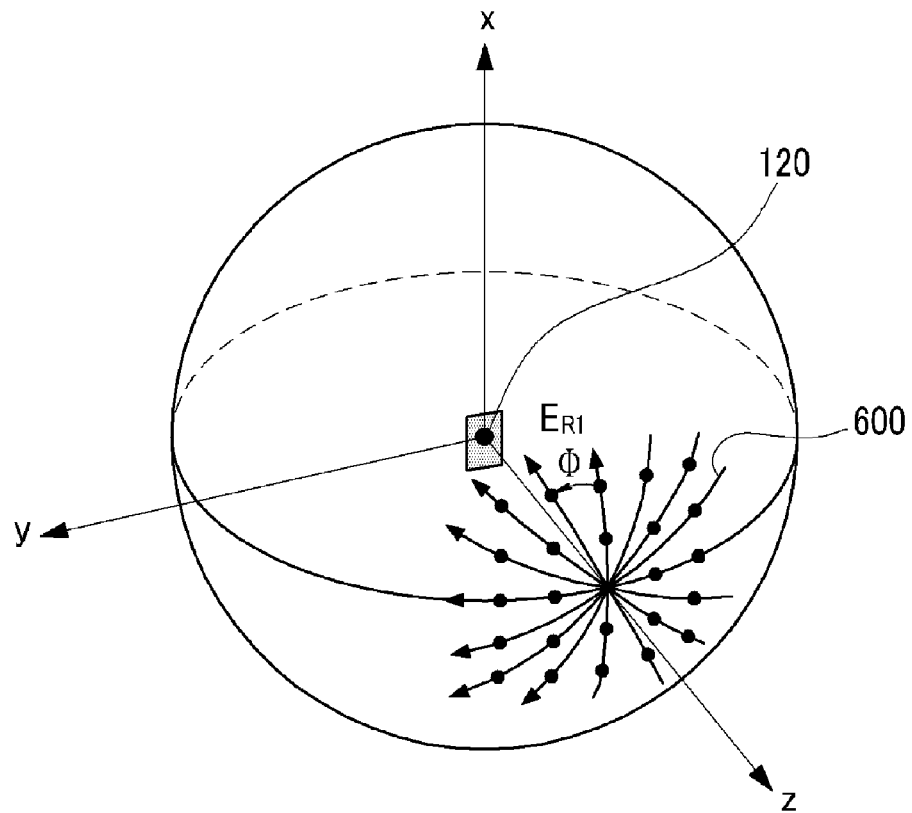

APPARATUS AND METHOD FOR MEASURING ANTENNA RADIATION PATTERNS

TECHNICAL FIELD

The present invention relates to an antenna radiation pattern measuring system. More particularly, it relates to a system that changes an antenna radiation pattern within a finite distance.

BACKGROUND ART

In general, in the case of an electromagnetic field that is radiated to free space from an antenna, a reactive electric electromagnetic field is greater than a radiated electromagnetic field within a predetermined region, and the predetermined region is referred to as a reactive near-field region. Then, the radiated electromagnetic field becomes greater than the reactive electromagnetic field in a region that is referred to as a radiating near-field region. Here, the radiated near-field region is also referred to as the Fresnel region, and an electromagnetic field existing in this region is referred to as the Fresnel electromagnetic field.

Radio waves radiated from the antenna are transformed almost to plane waves after passing through the Fresnel region. At this time, a region where a distance R of the radio waves radiated from the antenna is greater than $2L^2/\lambda$ is referred to as a far-field region or the Fraunhofer region, and an electromagnetic field that exists in this region is referred to as a far-field. Here, L denotes an antenna aperture length, and $\lambda$ denotes an operation frequency wavelength.

A radio device such as a mobile communication base station radiates high power electromagnetic waves. Therefore, the strength of electromagnetic field should be known and a safe distance should be guided.

In order to obtain the Fresnel field or the far-field of the finite distance, measurement can be directly carried out at the corresponding location or in an anti-reflection chamber. Here, the anti-reflection chamber may be called an anechoic chamber.

When locating an antenna under test (AUT) for obtaining an electromagnetic field of a specific distance such as the Fresnel field or the far-field, the measurement can be directly carried out at the corresponding location if the anti-reflection chamber is large enough to include a distance to be measured. However, when the distance to be measured is larger than the size of the anti-reflection chamber, an anti-reflection chamber that is larger than the existing anti-reflection chamber should be provided. In addition, a distance between a probe and the AUT should be variable, and therefore the anti-reflection chamber should have distance control equipment.

The above information disclosed in this Background section is only for enhancement of understanding of the background of the invention and therefore it may contain information that does not form the prior art that is already known in this country to a person of ordinary skill in the art.

DISCLOSURE OF INVENTION

Technical Problem

The present invention has been made in an effort to provide an antenna radiation pattern measurement device and an antenna radiation pattern measuring method having the advantage of obtaining an antenna radiation pattern within a predetermined distance from a radiation pattern of an antenna at another predetermined distance from a source antenna.

Technical Solution

An exemplary antenna radiation pattern measurement device according to an embodiment of the present invention measures a radiation pattern of an antenna under test (AUT) by using a source antenna. The antenna radiation pattern measurement device includes a control unit, an analysis unit, and a measurement unit. The control unit controls driving of the source antenna and the AUT, the analysis unit measures an electric field value from a radio frequency (RF) signal that is transmitted from one of the source antenna and the AUT and received by the other antenna, and the measurement unit controls the control unit and the analysis unit and measures a radiation pattern of the AUT by using the electric field value.

An exemplary method for measuring an antenna radiation pattern according to another embodiment of the present invention measures a radiation pattern of an AUT by using a source antenna in an antenna radiation pattern measurement device. The method includes: measuring electric field values at a plurality of points on a sphere having a radius of a first length while maintaining a distance of the first length between the source antenna and the AUT; and measuring a radiation pattern in a region at a distance of a second length from the AUT by using the electric field values at the plurality of points.

Another exemplary method for measuring a radiation pattern of a second antenna by using a first antenna in an antenna radiation pattern measurement device according to another embodiment of the present invention includes: transmitting a signal from one of the first and second antennas to the other antenna by moving at least one of the first and second antennas while maintaining a distance of a first length between the first antenna and the second antenna; receiving the signal and measuring electric field values at a plurality of points on a sphere having a radius of the first length; and measuring a radiation pattern of a region at a distance of the second length from the second antenna by using the electric field values at the plurality of points, the first length, the second length, and locations of the plurality of points on the sphere.

Advantageous Effects

According to the exemplary embodiments of the present invention, a radiation pattern of an antenna at a location at a distance that is larger than a small-sized anti-reflection chamber can be obtained, thereby increasing utility of the chamber.

In addition, the magnitude of an electromagnetic field in accordance with a distance can be predicted by obtaining an antenna radiation pattern with a finite distance, and accordingly, distance control equipment for varying a distance between the source antenna and the AUT may not be needed.

BRIEF DESCRIPTION OF THE DRAWINGS

FIG. 3 shows a method for scanning an electric field while varying an elevation angle according to the exemplary embodiment of the present invention.

FIG. 4 shows a method for scanning an electric field while varying an angle according to the exemplary embodiment of the present invention.

MODE FOR THE INVENTION

Figure 1:
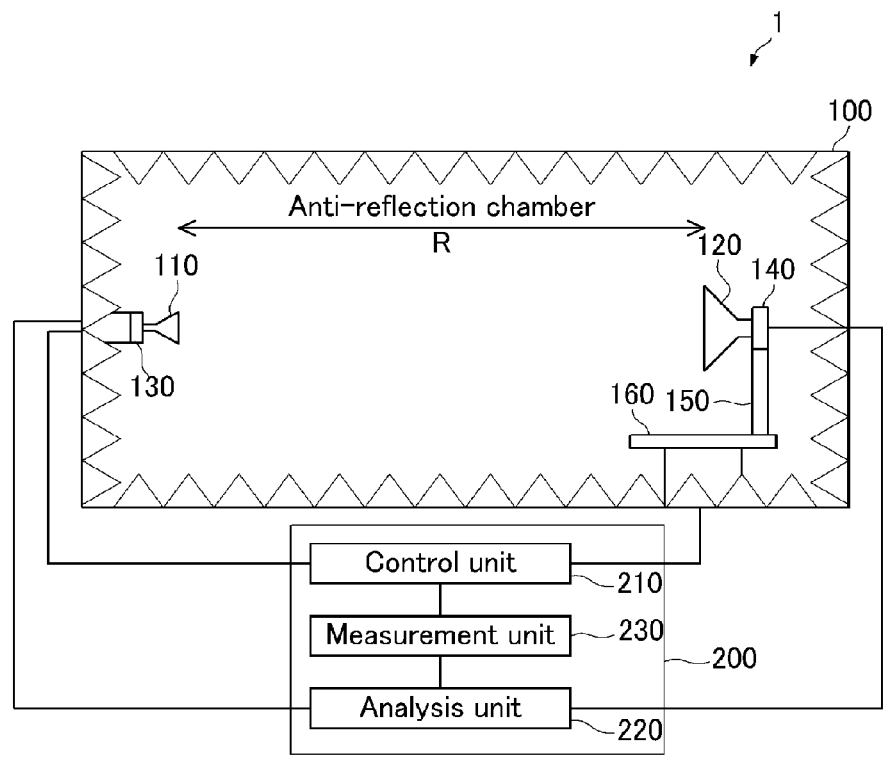
FIG. 1 shows an antenna radiation pattern transforming system according to an exemplary embodiment of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

In addition, unless explicitly described to the contrary, the word "comprise", and variations such as "comprises" and "comprising", will be understood to imply the inclusion of stated elements but not the exclusion of any other elements.

Hereinafter, an antenna radiation pattern measurement system according to an exemplary embodiment of the present invention will be described in further detail.

Figure 2:
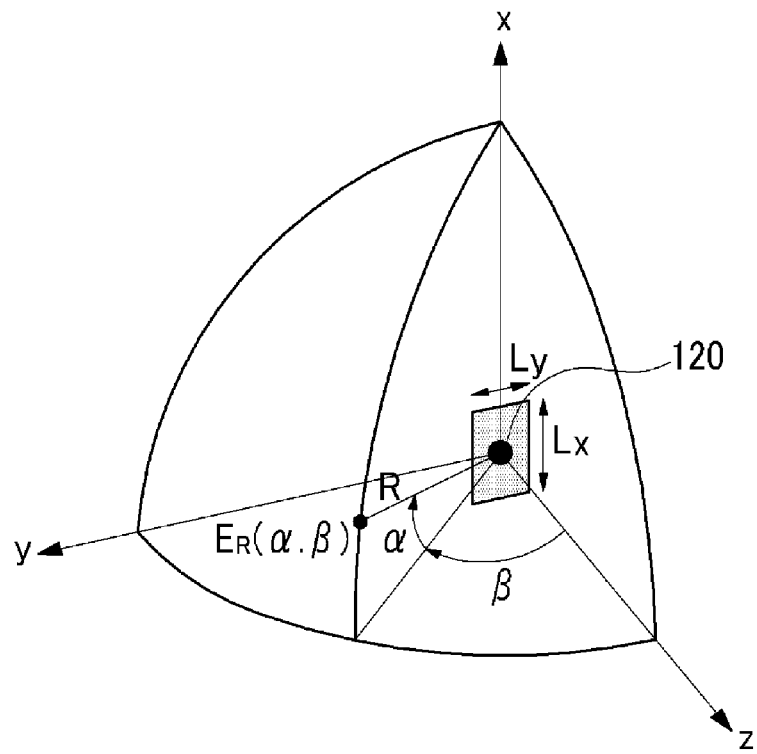
FIG. 2 shows an angular coordinate of an antenna disposed in the antenna radiation pattern transforming system.

FIG. 1 shows an antenna radiation pattern transforming system according to an exemplary embodiment of the present invention, and FIG. 2 shows an angular coordinate of an antenna of the radiation pattern transforming system.

As shown in FIG. 1, an antenna radiation pattern transforming system 1 includes an anti-reflection chamber 100 and an antenna radiation pattern measurement device 200, and the antenna radiation pattern measurement device 200 includes a control unit 210, an analysis unit 220, and a measurement unit 230.

The anti-reflection chamber 100 includes a source antenna 110, an antenna under test (AUT) 120, driving devices 130 and 140, a supporting device 150, and a horizontal rotation device 160.

A distance R between the source antenna 110 and the AUT 120 within the anti-reflection chamber 100 is approximately $2L^2/\lambda$. Here, L is an antenna aperture length, and $\lambda$ is an operation frequency wavelength. The driving device 130 is connected to the source antenna 110 and the driving device 140 is connected to the AUT 120, and the driving devices 130 and 140 control the antenna by varying a measurement height and a measurement angle of each of the antennas 110 and 120. The supporting device 150 is connected between the AUT 120 and the horizontal rotation device 160, and the horizontal rotation device 160 horizontally rotates the supporting device 150 for acquiring data according to a rotation angle.

The control unit 210 controls a motor for AUT automatically driving the driving devices 130 and 140 and the horizontal rotation device 160.

The analysis unit 220 transmits a radio frequency (RF) signal with an antenna that is set to be a transmission antenna among the source antenna 110 and the AUT 120 through an RF signal cable. The analysis unit 220 receives an RF signal with an antenna that is not set to be the transmission antenna among the source antenna 110 and the AUT 120 through the RF signal cable. In this instance, the analysis unit 220 measures complex electric field values of radiation patterns at every angle for a radiation pattern to be measured from the transmitted/received RF signal, and transmits the measured complex electric field values to the measurement unit 230.

The measurement unit 230 determines a parameter required for measuring a radiation pattern of the antenna. In addition, the measurement unit 230 controls the control unit 210 and the analysis unit 220 for measuring the radiation pattern at every angle that is required for antenna radiation pattern measurement. The measurement unit 230 stores the complex electric field values measured at every angle, transmitted from the analysis unit 220, and measures a radiation pattern to be measured by using the stored complex electric field values.

As shown in FIG. 2, the AUT 120 whose radiation pattern is to be measured is located at the origin of the angular coordinate system in the anti-reflection chamber 100. Here, Lx denotes the length of an aperture in the X-axis direction of the AUT 120, and Ly denotes the length of an aperture of the y-axis direction of the AUT 120. In addition, R denotes a distance from the origin to an electric field value $[E_R(\alpha,\beta)]$ to be measured. The source antenna 110 is located at the black dot represented by the $E_R(\alpha,\beta)$. Herein, $\alpha$ is the angle to the x-axis direction from the y-z plane, and $\beta$ is the angle to the z-axis direction from the x-z plane.

Hereinafter, an electric field scanning method that is used for measuring an antenna radiation pattern will be described in further detail with reference to FIG. 3 to FIG. 5.

FIG. 3 shows an electric field scanning method with change of an elevation angle according to the exemplary embodiment of the present invention, and FIG. 4 shows an electric field scanning method with change of an angle according to the exemplary embodiment of the present invention. FIG. 5 shows an electric field scanning method with change of the height according to the exemplary embodiment of the present invention.

Figure 5:
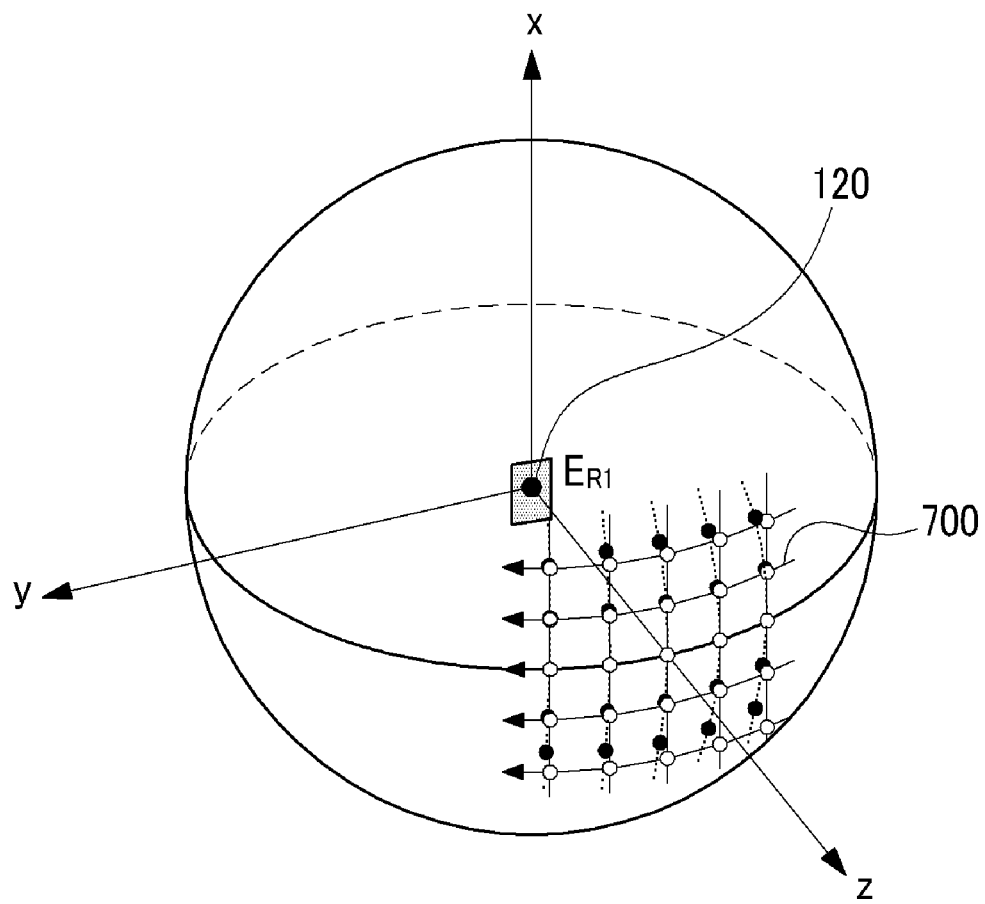
FIG. 5 shows a method for scanning an electric field while varying the height according to an exemplary embodiment of the present invention.

In FIG. 3 to FIG. 5, the AUT 120 whose radiation pattern is to be measured is located at the origin of the angular coordinate system. In FIG. 3 to FIG. 5, black dots show electric fields $E_{R1}$ at a distance of R1 from the AUT 120, and the electric fields $E_{R1}$ are scanned on a surface of a sphere having a radius of R1 (hereinafter, the sphere will be referred to as R1 sphere). Herein, the source antenna (110 of FIG. 1) is located at a point shown as the black dot on the surface of the R1 sphere, and performs RF transmission/reception.

As shown in FIG. 3, the electric field $E_{R1}$ can be scanned along the horizontal line where the black dot is located by rotating the AUT 120 in the horizontal direction while varying the elevation angle of one of the source antenna 110 and the AUT 120. In this instance, the elevation angle is an angle of the line of sight from the AUT 120 to the source antenna 110, and it can be changed by changing the motor and the supporting device 150 included in the driving devices 130 and 140 in the vertical or horizontal direction.

In addition, as shown in FIG. 4, the electric field $E_{R1}$ can be scanned along the plane where the black dot is located while varying the angle $\Phi$ of the source antenna 110 and the AUT 120. Here, the angle $\Phi$ is a rotation angle centering on the z-axis. Such a scanning method can be carried out by controlling the motor of the driving devices 130 and 140 to rotate centering on the z-axis while rotating the AUT 120 in the horizontal direction.

In addition, as shown in FIG. 5, the electric field $E_{R1}$ can be scanned while varying the height of the source antenna 110 and the height of the AUT 120 in the vertical direction around the R1 sphere.

In this instance, a location of the scanned measurement value is shown as a white dot in FIG. 5, and the magnitude and phase differences between the white dot and the black dot on the surface of the R1 sphere can be compensated by using a compensation algorithm. Such a scanning method can be carried out by controlling the motor of the driving devices 130 and 140 to let one of the source antenna 110 and the AUT 120 linearly move in the vertical direction with respect to the ground while letting the AUT 120 vertically move.

Hereinafter, an antenna radiation pattern measurement method will be described in further detail with reference to FIG. 6 and FIG. 7.

Figure 6:
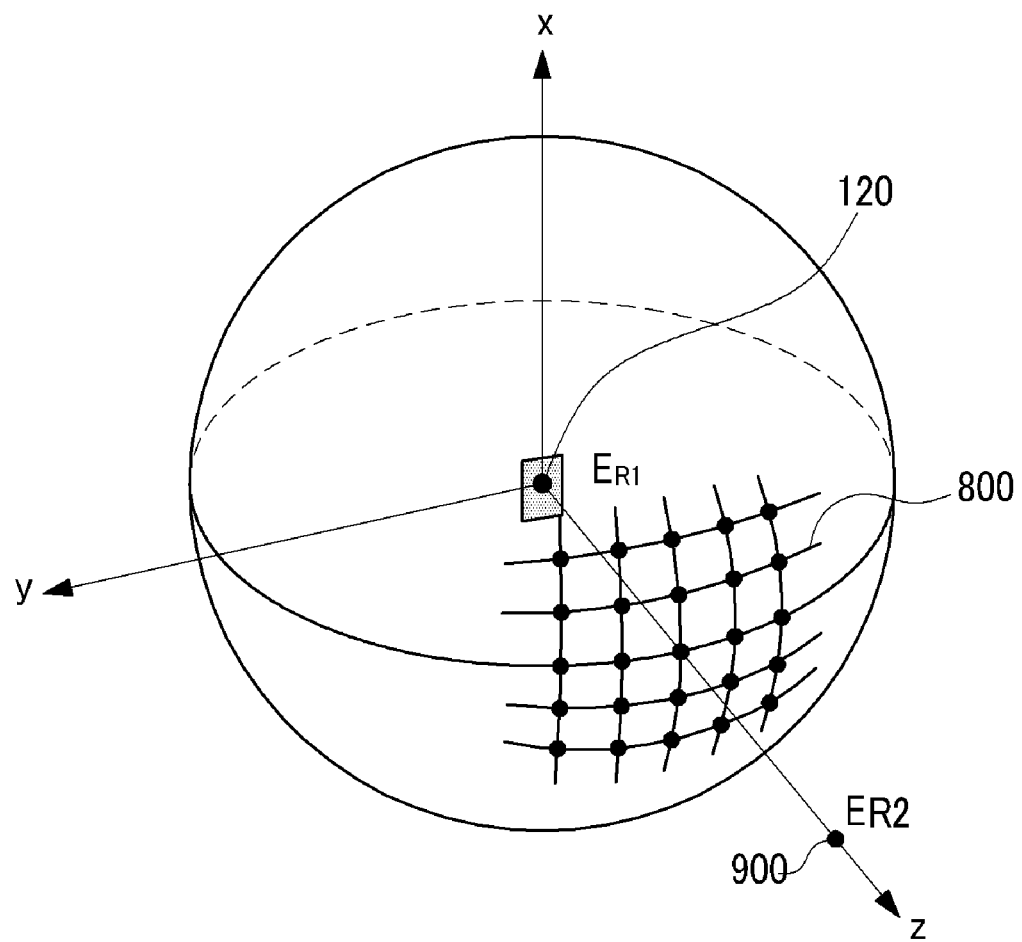
FIG. 6 shows an angular coordinate system for radiation pattern measurement of the antenna according to the exemplary embodiment of the present invention.
Figure 7:
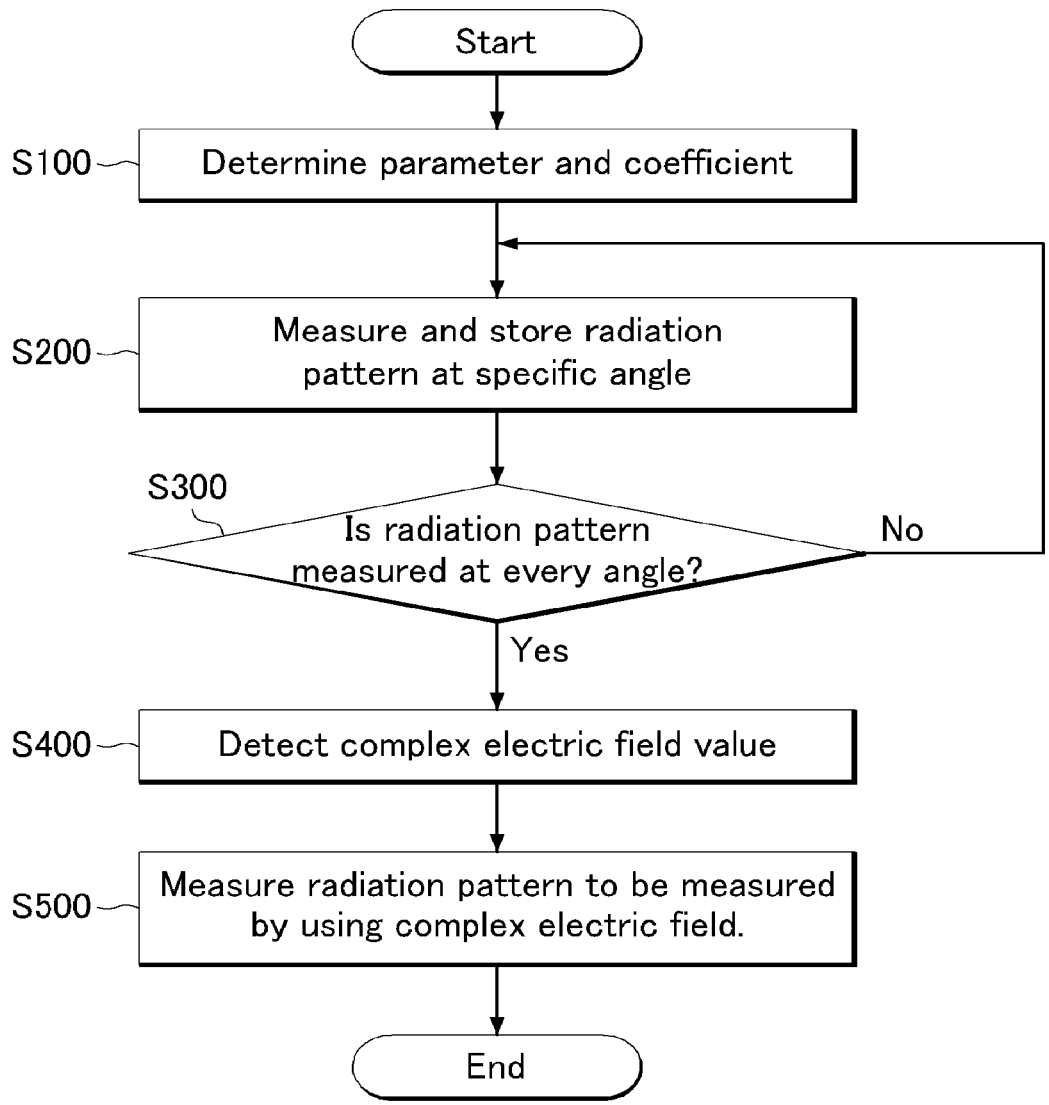
FIG. 7 is a flowchart showing a radiation pattern measuring method of the antenna according to the exemplary embodiment of the present invention.

FIG. 6 shows an angular coordinate system for radiation pattern measurement of an antenna according to the exemplary embodiment of the present invention, and FIG. 7 is a flowchart showing the antenna radiation pattern measurement method according to the exemplary embodiment of the present invention.

According to the exemplary embodiment of the present invention, one of the scanning methods shown in FIG. 3 to FIG. 5 is used, and it is assumed that an angle of the antenna is set to $\alpha=0°$ and $\beta=0°$.

As shown in FIG. 6, the AUT 120 whose radiation pattern is to be measured is located at the origin of the angular coordinate system. The electric fields $E_{R1}$ ($\alpha+m\Delta\alpha$, $\beta+n\Delta\beta$) 800, shown as the black dots, are separated from the AUT 120 by the distance R1, and are located on the surface of the R1 sphere.

In this instance, an electric field $E_{R2}$ ($\alpha,\beta$) 900 whose radiation pattern is to be measured is shown as the black dot located on the z-axis, and is separated from the AUT 120 by a distance R2.

A radiation pattern of the electric field $E_{R2}$ ($\alpha,\beta$) 900 can be obtained by using a transforming method as given in Equation 1.

$$E_{R2}(\alpha, \beta) = K \sum_{m=-\infty}^{+\infty} \sum_{n=-\infty}^{+\infty} k_{mn} E_{R1}(\alpha + m\Delta\alpha, \beta + n\Delta\beta)$$ [Equation 1]

Equation 1 uses the electric field $E_{R1}$ ($\alpha+m\Delta\alpha$, $\beta+n\Delta\beta$) 800 in a region at the distance R1, a coefficient K of Equation 2, and a coefficient $k_{mn}$ of Equation 3. The coefficients K and $k_{mn}$ are determined by a location (m,n) where the two distances R1 and R2 and the electric field $E_{R1}$ ($\alpha+m\Delta\alpha$, $\beta+n\Delta\beta$) are measured as given in Equation 2 to Equation 4. Here, $\Delta\alpha$ denotes an increase value of an angle that varies from the y-z plane toward the x-axis direction, and $\Delta\beta$ denotes an increase value of an angle that varies from the x-z plane toward the y-axis direction. Therefore, electric field values at the plurality of points on the R1 sphere (that is, at every angle) can be measured while varying the location (m, n).

$$K = \frac{R_1}{R_2} e^{+jk(R_1 - R_2)}$$ [Equation 2]

$$k_{mn} = \frac{1}{T_x T_y} \int_{-T_x/2}^{T_x/2} e^{+ip^2 u^2} e^{-i2\pi mu/T_x} du \int_{-T_y/2}^{T_y/2} e^{+ip^2 v^2} e^{-i2\pi nv/T_y} dv$$ [Equation 3]

In addition, an exponent p of Equation 3 is determined by Equation 4.

$$p^2 = \frac{\pi}{\lambda}\left(\frac{1}{R_1} - \frac{1}{R_2}\right)$$ [Equation 4]

In Equation 1 to Equation 4, k denotes a propagation constant (where, $k=2\pi/\lambda$), and $\lambda$ denotes an operation frequency wavelength. Tx denotes a length of a cut-plane that includes the aperture of the AUT 120 in the x-axis direction, and Ty denotes a length of a cut-plane that includes the aperture of the AUT 120 in the y-axis direction.

Referring to FIG. 6 and FIG. 7, the measurement unit 230 determines a parameter and a coefficient, required for calculating Equation 1 to Equation 4 that are applied for transforming an antenna radiation pattern, from a distance between the source antenna 110 and the AUT 120 in the anti-reflection chamber 100 and the size of the antenna aperture in order to measure an antenna radiation pattern (S100).

In addition, the measurement unit 230 controls the control unit 210 to drive the source antenna 110 and the AUT 120 according to a radiation pattern that will be measured, and the control unit 210 drives the horizontal rotation device 160 to horizontally rotate the AUT 120 and the supporting device 150. When the source antenna 110 and the AUT 120 transmit/receive an RF signal, the analysis unit 220 measures a complex electric field value from the RF signal and transmits the measured complex electric field value to the measurement unit 230, and the measurement unit 230 stores the received complex electric field value in a database.

That is, the electric field $E_{R1}$ ($\alpha+m\Delta\alpha$, $\beta+n\Delta\beta$) in a region at the distance R1 from the AUT 120 is measured with respect to a specific angle ($\alpha$, $\beta$) at the distance R2 from the AUT 120 (S200).

The measurement unit 230 determines radiation patterns are measured at every angle, that is, a plurality of points on the sphere R1 (S300). If the radiation patterns are not measured at every angle, the measurement unit 230 performs the step S200. If the radiation patterns are measured at every angle, the measurement unit 230 detects a complex electric field value for measuring a radiation pattern at the distance R1 from the database (S400). In addition, the measurement unit 230 carries out a process for measuring a desired-radiation pattern by applying the detected complex electric field value to Equation 1 to Equation 4 (S500).

Figure 8:
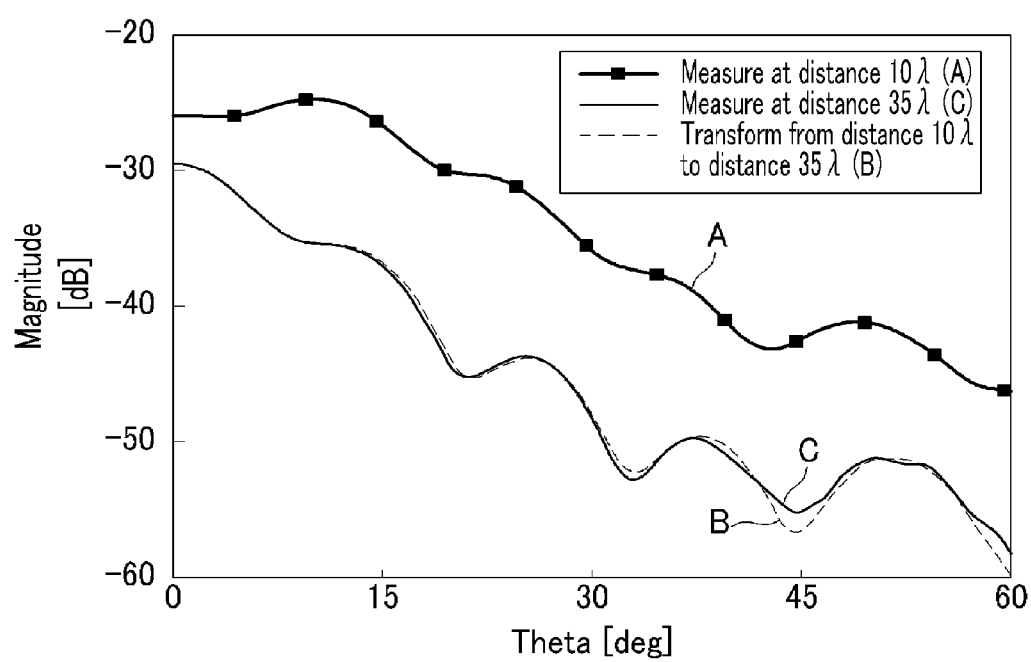
FIG. 8 shows a graph for verifying a result of the measured antenna radiation pattern of FIG. 7.

FIG. 8 shows a graph for verifying a result of the radiation pattern of the antenna measured in FIG. 7.

In FIG. 8, a horn antenna is used as an AUT in a small anti-reflection chamber for verifying the radiation pattern transforming method.

As shown in FIG. 8, the horn antenna is located in a Fresnel region at a distance of 10o from the source antenna and a radiation pattern A at a distance of 35$\lambda$ is measured. Here, $\lambda$ denotes an operation frequency wavelength.

In this instance, a scanning method of the radiation pattern A in the Fresnel region is set to change the height of the source antenna of the height of the horn antenna from around a sphere at a distance of 10$\lambda$ to the vertical direction as shown in FIG. 5. That is, as shown in FIG. 5, the radiation pattern A at the distance $\lambda$ is measured by applying an algorithm that compensates the magnitude and phase differences between a location of a measured value obtained by varying a measurement height and horizontally rotating the x-axis and the black dots on the surface of the sphere. FIG. 8 shows a radiation pattern at a=0°.

The radiation pattern measured in this way is transformed to a radiation pattern B at a distance of 35λ according to the antenna radiation pattern transforming process of FIG. 7.

In addition, in order to improve accuracy of the radiation pattern B measured according to the antenna radiation pattern transforming process, the horn antenna is located at the distance of 35λ from the source antenna and a radiation pattern C at the distance of 35λ is measured. The comparison result shows that the radiation pattern B is almost identical to the radiation pattern C measured by actually locating the horn antenna, as shown in FIG. 8.

As described, a radiation pattern of an antenna at a distance out of the anti-reflection chamber can be measured by measuring a radiation pattern at a specific distance and transforming the measured radiation pattern to a radiation pattern at another specific distance according to the antenna radiation pattern transforming process.

The above-described embodiments can be realized through a program for realizing functions corresponding to the configuration of the embodiments or a recording medium for recording the program in addition to through the above-described device and/or method, which is easily realized by a person skilled in the art.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

The invention claimed is:

1. An antenna radiation pattern measurement device that measures a radiation pattern of an antenna under test (AUT) by using a source antenna, comprising:
    a control unit for controlling driving of the source antenna and the AUT;
    an analysis unit for measuring an electric field value from a radio frequency (RF) signal that is transmitted from the source antenna and received by the AUT or transmitted from the AUT and received by the source antenna; and
    a measurement unit for controlling the control unit to drive the source antenna or the AUT to a plurality of positions, controlling the analysis unit to measure electric field values at the plurality of the positions, and determining a radiation pattern of the AUT by using the electric field values measured;
    wherein the analysis unit measures the electric field value at a plurality of points corresponding to the plurality of positions, while maintaining a distance between the source antenna and the AUT by a first length, and the measurement unit determines a radiation pattern at a region at a distance of a second length from the AUT by using the electric field values at the plurality of points and a value corresponding to a ratio between the first length and the second length; and
    wherein the value corresponding to a ratio between the first length and the second length is expressible as $$K = \frac{R_1}{R_2} e^{+jk(R_1-R_2)},$$

where R1 corresponds to the first length and represents a first distance in an angular coordinate system from an origin to a point on a sphere, and R2 corresponds to the second length and represents a second distance in the angular coordinate system, greater than the first radial distance, from the origin to a point beyond the sphere.

2. The antenna radiation pattern measurement device of claim 1, wherein the plurality of points are located on a sphere having a radius of the first length.

3. The antenna radiation pattern measurement device of claim 2, wherein the measurement unit determines the radiation pattern by multiplying the electric field values with coefficients respectively determined at the plurality of points and adding the multiplication results, and the coefficients are determined by the first length, the second length, and a location of each of the plurality of points on the sphere.

4. The antenna radiation pattern measurement device of claim 1, wherein the source antenna and the AUT are provided in an anti-reflection chamber, and the anti-reflection chamber comprises:
    a first driving device connected to the source antenna and configured to drive the source antenna;
    a second driving device connected to the AUT and configured to drive the AUT; and
    a horizontal rotation device configured to horizontally rotate at least one of the source antenna or the AUT.

5. The antenna radiation pattern measurement device of claim 1, wherein an electric field at the distance of the first length is an electric field in a Fresnel region, and an electric field at the distance of the second length is an electric field in one of the Fresnel region or a far-field region.

6. A method for measuring a radiation pattern of an antenna under test (AUT) by using a source antenna in an antenna radiation pattern measurement device, the method comprising:
    measuring electric field values at a plurality of points on a sphere having a radius of a first length while maintaining a distance of the first length between the source antenna and the AUT; and
    determining a radiation pattern in a region at a distance of a second length from the AUT by using the electric field values measured at the plurality of points and a value corresponding to a ratio between the first length and the second length;
    wherein the value corresponding to a ratio between the first length and the second length is expressible as $$K = \frac{R_1}{R_2} e^{+jk(R_1-R_2)},$$

where R1 corresponds to the first length and represents a first distance in an angular coordinate system from an origin to a point on a sphere, and R2 corresponds to the second length and represents a second distance in the angular coordinate system, greater than the first radial distance, from the origin to a point beyond the sphere.

7. The method of claim 6, wherein the measuring of the electric field values further comprises measuring the electric field values at the plurality of points from a radio frequency (RF) signal transmitted from the source antenna and received by the AUT or transmitted from the AUT and received by the source antenna.

8. The method of claim 6, wherein the determining of the radiation pattern comprises multiplying the electric fields with coefficients respectively determined at the plurality of points and adding results of the multiplying.

9. The method of claim 8, further comprising determining the coefficients based on the first length, the second length, and each of the plurality of points on the sphere.

10. A method for measuring a radiation pattern of a second antenna by using a first antenna in an antenna radiation pattern measurement device, the method comprising:
- moving at least one of the first antenna or the second antenna while maintaining a distance of a first length between the first antenna and the second antenna;
- receiving a signal transmitted from the first antenna to the second antenna, or from the second antenna to the first antenna, and measuring electric field values at a plurality of points on a sphere having a radius of the first length; and
- determining a radiation pattern of a region at a distance of the second length from the second antenna based on the electric field values measured at the plurality of points, the first length, the second length, a value corresponding to a ratio between the first length and the second length, and locations of the plurality of points on the sphere;
- wherein the value corresponding to a ratio between the first length and the second length is expressible as $$K = \frac{R_1}{R_2} e^{+jk(R_1 - R_2)},$$

where R1 corresponds to the first length and represents a first distance in an angular coordinate system from an origin to a point on a sphere, and R2 corresponds to the second length and represents a second distance in the angular coordinate system, greater than the first radial distance, from the origin to a point beyond the sphere.

11. The method of claim 10, wherein the determining of the radiation pattern comprises multiplying the electric field values with coefficients that are respectively determined at the plurality of points and adding the multiplication results, and the coefficients are determined by the first length, the second length, and each location of the plurality of points on the sphere.

* * * * *